(12) United States Patent
Chen et al.

(10) Patent No.: US 9,935,289 B2
(45) Date of Patent: Apr. 3, 2018

(54) ENVIRONMENTAL SENSITIVE ELEMENT PACKAGE AND ENCAPSULATION METHOD THEREOF

(71) Applicant: Industrial Technology Research Institute, Hsinchu (TW)

(72) Inventors: Kuang-Jung Chen, Hsinchu County (TW); Shu-Tang Yeh, Taichung (TW); Yung-Sheng Wang, Taichung (TW)

(73) Assignee: Industrial Technology Research Institute Institute, Hsinchu (TW)

( * ) Notice: Subject to any disclaimer, the term of this patent is extended or adjusted under 35 U.S.C. 154(b) by 56 days.

(21) Appl. No.: 15/003,805

(22) Filed: Jan. 22, 2016

(65) Prior Publication Data

US 2016/0204379 A1 Jul. 14, 2016

Related U.S. Application Data

(63) Continuation-in-part of application No. 12/915,018, filed on Oct. 29, 2010, now abandoned.
(Continued)

(30) Foreign Application Priority Data

Sep. 10, 2010 (TW) .............................. 99130696 A

(51) Int. Cl.
*H01L 51/52* (2006.01)
*B32B 7/12* (2006.01)
(Continued)

(52) U.S. Cl.
CPC ............ *H01L 51/5253* (2013.01); *B32B 3/30* (2013.01); *B32B 7/12* (2013.01); *B32B 15/08* (2013.01);
(Continued)

(58) Field of Classification Search
None
See application file for complete search history.

(56) References Cited

U.S. PATENT DOCUMENTS

| 5,855,994 A | 1/1999 | Biebuyck et al. |
| 6,576,351 B2 | 6/2003 | Silvernail |

(Continued)

FOREIGN PATENT DOCUMENTS

| CN | 1496198 | 5/2004 |
| CN | 1806348 | 7/2006 |

(Continued)

OTHER PUBLICATIONS

"EL-92735"; Adhesive Research, Inc. (Jun. 14, 2011); <http://www.adhesivesresearch.com/wp-content/uploads/2013/10/92735-Data-Sheet.pdf>.*

(Continued)

*Primary Examiner* — David Sample
*Assistant Examiner* — Donald M Flores, Jr.
(74) *Attorney, Agent, or Firm* — JCIPRNET

(57) ABSTRACT

A package of environmental sensitive element including a first substrate, a second substrate, a barrier structure between the first substrate and the second substrate, an environmental sensitive element and an adhesive is provided. The second substrate is disposed above the first substrate. The environmental sensitive element is disposed on the first substrate and located between the first substrate and the second substrate. The barrier structure is distributed outside the environmental sensitive element. The adhesive is disposed between the first substrate and the second substrate and encapsulates the environmental sensitive element and the barrier structure, wherein an outgassing of the adhesive under 120 degrees Celsius is less than or equal to $5 \times 10^{-7}$ gram/cm$^2$.

14 Claims, 18 Drawing Sheets

Related U.S. Application Data

(60) Provisional application No. 62/106,234, filed on Jan. 22, 2015.

(51) Int. Cl.

| | | |
|---|---|---|
| *B32B 15/08* | (2006.01) | |
| *B32B 15/18* | (2006.01) | |
| *B32B 17/06* | (2006.01) | |
| *B32B 27/06* | (2006.01) | |
| *B32B 27/28* | (2006.01) | |
| *B32B 27/30* | (2006.01) | |
| *B32B 27/36* | (2006.01) | |
| *B32B 3/30* | (2006.01) | |

(52) U.S. Cl.
CPC .............. *B32B 15/18* (2013.01); *B32B 17/06* (2013.01); *B32B 27/06* (2013.01); *B32B 27/281* (2013.01); *B32B 27/286* (2013.01); *B32B 27/308* (2013.01); *B32B 27/36* (2013.01); *B32B 27/365* (2013.01); *H01L 51/525* (2013.01); *H01L 51/5246* (2013.01); *H01L 51/5259* (2013.01); *B32B 2255/10* (2013.01); *B32B 2255/20* (2013.01); *B32B 2255/26* (2013.01); *B32B 2307/546* (2013.01); *B32B 2307/724* (2013.01); *B32B 2307/726* (2013.01); *B32B 2307/7244* (2013.01); *B32B 2307/7246* (2013.01); *B32B 2439/62* (2013.01); *B32B 2457/20* (2013.01); *B32B 2553/00* (2013.01); *H01L 2251/55* (2013.01); *Y10T 428/239* (2015.01)

(56) References Cited

U.S. PATENT DOCUMENTS

| | | | |
|---|---|---|---|
| 6,866,901 B2 | 3/2005 | Burrows et al. | |
| 6,998,776 B2 | 2/2006 | Aitken et al. | |
| 7,119,409 B2 | 10/2006 | Kawamura et al. | |
| 7,256,543 B2 | 8/2007 | Su et al. | |
| 7,541,671 B2 | 6/2009 | Foust et al. | |
| 7,648,925 B2 | 1/2010 | Moro et al. | |
| 7,652,424 B2* | 1/2010 | Park | H01L 51/5246 313/504 |
| 7,728,516 B2 | 6/2010 | Kawaguchi et al. | |
| 8,093,512 B2 | 1/2012 | Chen et al. | |
| 8,253,328 B2 | 8/2012 | Hayashi | |
| 8,264,143 B2 | 9/2012 | Bae et al. | |
| 8,288,944 B2 | 10/2012 | Lee et al. | |
| 8,624,247 B2 | 1/2014 | Choi | |
| 8,742,411 B2 | 6/2014 | Yoo et al. | |
| 8,803,184 B2 | 8/2014 | Lee et al. | |
| 2003/0064171 A1 | 4/2003 | Burrows et al. | |
| 2004/0079940 A1 | 4/2004 | Redecker et al. | |
| 2004/0197944 A1 | 10/2004 | Chen et al. | |
| 2004/0265508 A9* | 12/2004 | Burrows | H01L 23/564 428/1.1 |
| 2005/0037193 A1* | 2/2005 | Sun | C23C 16/4404 428/332 |
| 2005/0142382 A1 | 6/2005 | Menda et al. | |
| 2005/0179379 A1 | 8/2005 | Kim | |
| 2005/0184372 A1 | 8/2005 | Asahi et al. | |
| 2005/0238803 A1 | 10/2005 | Tremel et al. | |
| 2005/0249901 A1 | 11/2005 | Yializis et al. | |
| 2005/0287688 A1 | 12/2005 | Won et al. | |
| 2006/0006798 A1 | 1/2006 | Buckley | |
| 2006/0093795 A1* | 5/2006 | Wang | B01D 53/261 428/195.1 |
| 2006/0113617 A1 | 6/2006 | Kawamura et al. | |
| 2006/0118933 A1 | 6/2006 | Haba | |
| 2006/0139555 A1 | 6/2006 | Janssen et al. | |
| 2006/0202613 A1 | 9/2006 | Kawaguchi et al. | |
| 2006/0226523 A1 | 10/2006 | Foust et al. | |
| 2006/0278965 A1* | 12/2006 | Foust | H01L 51/524 257/678 |
| 2007/0152956 A1 | 7/2007 | Danner et al. | |
| 2007/0172971 A1 | 7/2007 | Boroson | |
| 2007/0241674 A1 | 10/2007 | Chao et al. | |
| 2008/0006819 A1 | 1/2008 | McCormick et al. | |
| 2008/0012477 A1 | 1/2008 | Koo et al. | |
| 2008/0135998 A1 | 6/2008 | Witvrouw et al. | |
| 2008/0284331 A1 | 11/2008 | Hayashi | |
| 2009/0001877 A1 | 1/2009 | Park et al. | |
| 2010/0019654 A1 | 1/2010 | Hayashi | |
| 2011/0101564 A1 | 5/2011 | Keenihan et al. | |
| 2011/0140599 A1 | 6/2011 | Lee et al. | |
| 2011/0303943 A1 | 12/2011 | Lee et al. | |
| 2013/0240848 A1 | 9/2013 | Lin | |
| 2014/0217621 A1 | 8/2014 | Yoo et al. | |
| 2014/0305900 A1 | 10/2014 | Rogers et al. | |

FOREIGN PATENT DOCUMENTS

| | | |
|---|---|---|
| CN | 1894790 | 1/2007 |
| CN | 101308864 | 11/2008 |
| CN | 102183858 | 9/2011 |
| CN | 103325953 | 9/2013 |
| CN | 103779389 | 5/2014 |
| CN | 103887449 | 6/2014 |
| CN | 103998239 | 8/2014 |
| TW | 570472 | 1/2004 |
| TW | 200525002 | 8/2005 |
| TW | 200603416 | 1/2006 |
| TW | I272865 | 2/2007 |
| TW | 200913765 | 3/2009 |
| TW | I314025 | 8/2009 |
| TW | 201012648 | 4/2010 |
| TW | I421607 | 1/2014 |
| TW | 201411906 | 3/2014 |
| TW | I430885 | 3/2014 |
| TW | I434250 | 4/2014 |
| TW | 201417224 | 5/2014 |
| TW | I437526 | 5/2014 |
| TW | 201438316 | 10/2014 |
| WO | 2009036272 | 3/2009 |
| WO | 2011086500 | 7/2011 |

OTHER PUBLICATIONS

"EL-92638"; Adhesive Research, Inc. (May 24, 2011); <http://www.adhesivesresearch.com/wp-content/uploads/2013/10/92638-Data-Sheet.pdf>.*

Schmidt et al., "Adhesion and Barrier Performance of Novel Barrier Adhesives Used in Multilayered High-Barrier Laminates," Journal of Adhesion Science and Technology, May 2012, 2405-2436.

Chu et akl., "Analysis of Failure Modes of Multilayer Thin Film Encapsulation of OLED Devices and Ca Films," IDW '04 the 11th International Display Workshops, Dec. 2004, pp. 1427-1428.

Kwong et al., "Current status of electrophosphorescent device stability," Organic Electronics, Sep. 2003, pp. 155-164.

Kim et al., "Effects of argon and oxygen flow rate on water vapor barrier properties of silicon oxide coatings deposited on polyethylene terephthalate by plasma enhanced chemical vapor deposition," Thin Solid Films, Jul. 2009, pp. 1929-1934.

Dennler et al., "A new encapsulation solution for flexible organic solar cells," Thin Solid Films, Jan. 2006, pp. 349-353.

Walker et al., "2006 OLEDs World Summit: a personal view," Veritas et Visus Flexible Substrate, Jan. 2007, pp. 39-46.

Kim et al., "High-quality thin-film passivation by catalyzer-enhanced chemical vapor deposition for organic light-emitting diodes," Applied Physics Letters, Jan. 2007, pp. 013502.

Lewis et al., "Thin-Film Permeation-Barrier Technology for Flexible Organic Light-Emitting Devices," IEEE Journal of Selected Topics in Quantum Electronics, Jan. 2004, pp. 45-57.

Huang et al., "Low temperature PECVD SiNx films applied in OLED packaging," Materials Science and Engineering B98, Apr. 2003, pp. 248-254.

(56) References Cited

OTHER PUBLICATIONS

Weaver et al., "Organic light-emitting devices with extended operating lifetimes on plastic substrates," Applied Physics Letters, Oct. 2002, pp. 2929-2931.
Peter Van De Weijer et al., "White paper on the characterisation of thin-film barrier layers for protection of organic Light-Emitting Diodes", ICT-216641 Fast2light, Sep. 2009, pp. 1-17.
Park et al., "Thin film encapsulation for flexible AM-OLED: a review," Semiconductor Science and Technology, Feb. 2011, pp. 1-9.
Burrows et al., "Ultra barrier flexible substrates for flat panel displays," Display, May 2001, pp. 65-69.
Febreguette et al., "Ultrahigh x-ray reflectivity from W/Al2O3 multilayers fabricated using atomic layer deposition," Applied Physics Letters, Jan. 2006, pp. 013116.
"Office Action of Taiwan Counterpart Application No. 99130696," dated Apr. 14, 2014, p. 1-p. 15, in which the listed references (Ref. 1-4) were cited.
"Office Action of Taiwan Related Application, application No. 104115559", dated May 17, 2016, p. 1-p. 9, in which the listed references were cited.
"Office Action of China Related Application No. 201510489470.3," dated Apr. 6, 2017, p. 1-p. 7, in which the listed references were cited.

\* cited by examiner

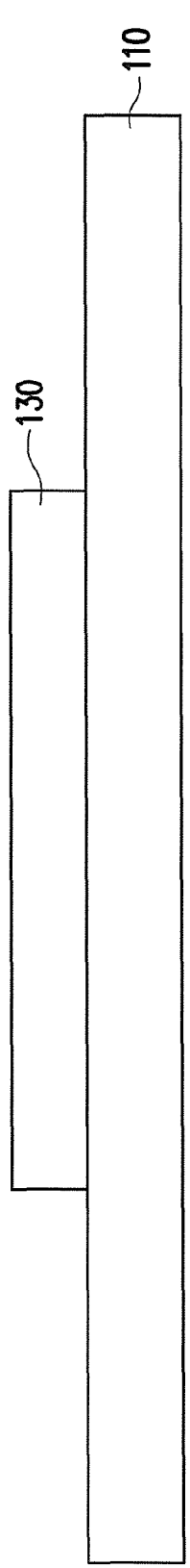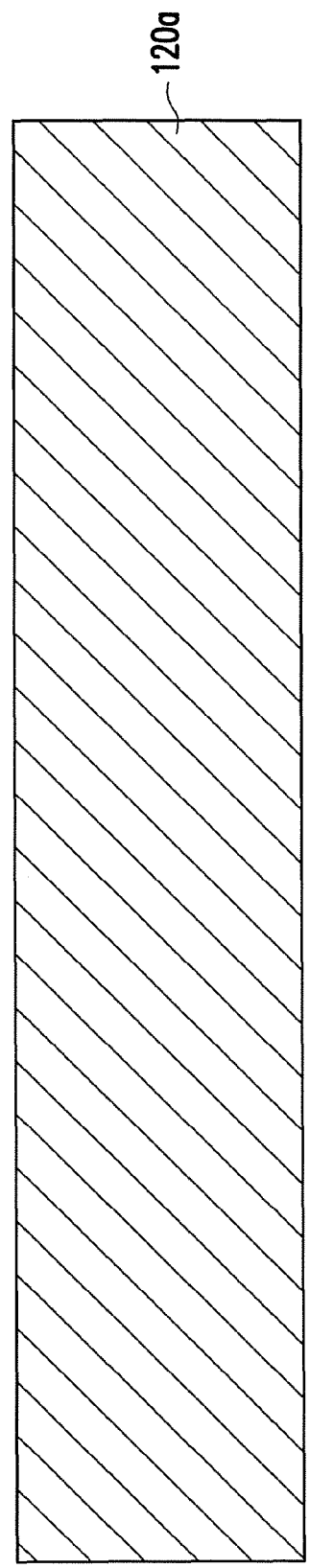

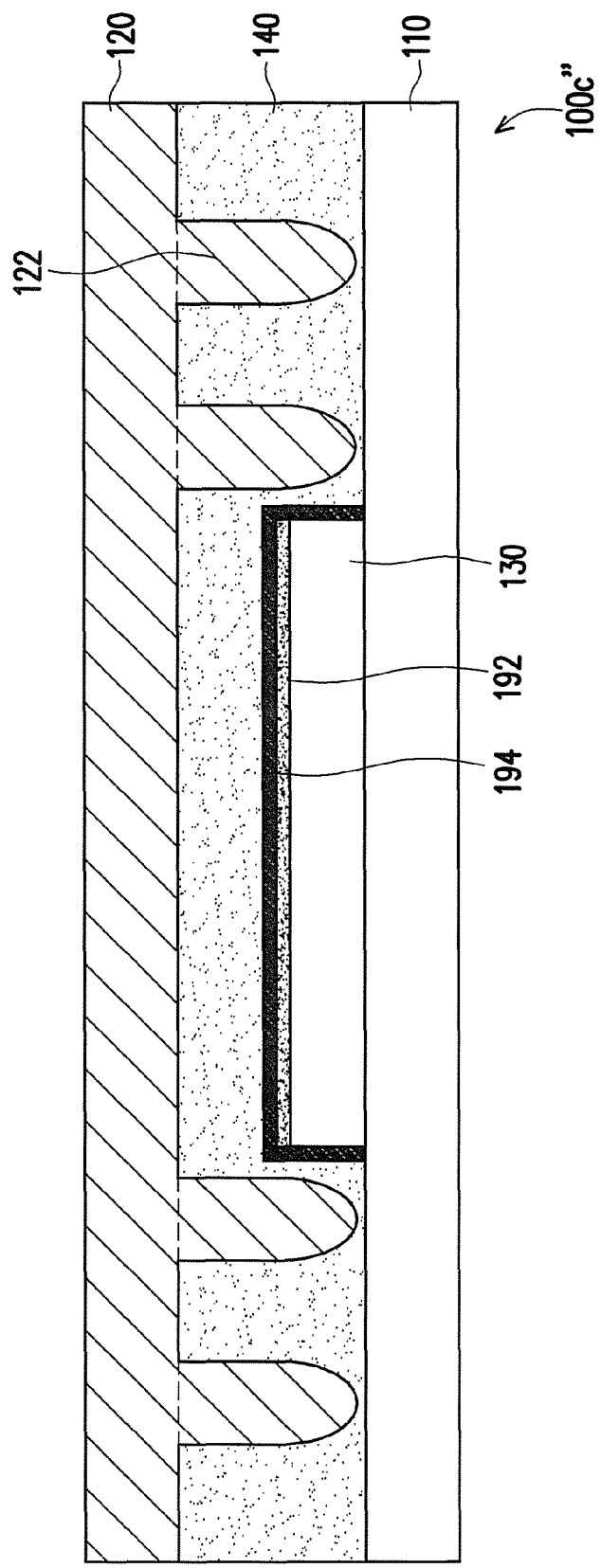
FIG. 3"

ENVIRONMENTAL SENSITIVE ELEMENT PACKAGE AND ENCAPSULATION METHOD THEREOF

CROSS-REFERENCE TO RELATED APPLICATION

This application is a continuation-in-part application of and claims the priority benefit of U.S. prior application Ser. No. 12/915,018, filed Oct. 29, 2010, now pending. The prior application Ser. No. 12/915,018 claims the priority benefits of Taiwan application serial no. 99130696, filed on Sep. 10, 2010. This application also claims the priority benefits of U.S. provisional application Ser. No. 62/106,234, filed on Jan. 22, 2015. The entirety of each of the above-mentioned patent applications is hereby incorporated by reference herein and made a part of this specification.

BACKGROUND

Field of the Application

The disclosure relates to a package, and also relates to an environmental sensitive element package.

Related Art

Flexible substrates have a wider application comparing to conventional rigid substrates. Flexible substrates are advantageous for their flexibility, portability, safety standard satisfaction, and wide product application. However, flexible substrates may have high temperature intolerance, poor water and oxygen resistance, poor chemical resistance, and large thermal expansion coefficient. Typical flexible substrates can not block the permeation of vapor and oxygen completely, such that the devices inside the substrates are deteriorated rapidly. Consequently, the devices manufactured have reduced lifespan and can not meet commercial demands.

SUMMARY

An environmental sensitive element package is introduced herein to improve the problem of reduced lifespan of electronic devices due to the permeation of vapor and oxygen.

In one embodiment of the disclosure, an environmental sensitive element package is introduced. The package includes a first substrate, a second substrate, a barrier structure between the first substrate and the second substrate, an environmental sensitive element, and an adhesive. The second substrate is disposed above the first substrate. The environmental sensitive element is disposed on the first substrate and located between the first substrate and the second substrate. The barrier structure is distributed outside the environmental sensitive element. The adhesive is disposed between the first substrate and the second substrate and covers the environmental sensitive element and the barrier structure, wherein an outgassing of the adhesive under 120 degrees Celsius is less than or equal to $5 \times 10^{-7}$ gram/cm$^2$.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

FIGS. 1A to 1E are schematic diagrams illustrating a flow chart of an encapsulation method of an environmental sensitive element according to an exemplary embodiment.

FIG. 1E' is a schematic cross-sectional view of an environmental sensitive element package according to an alternative exemplary embodiment.

DESCRIPTION OF EMBODIMENTS

Figure 1C:
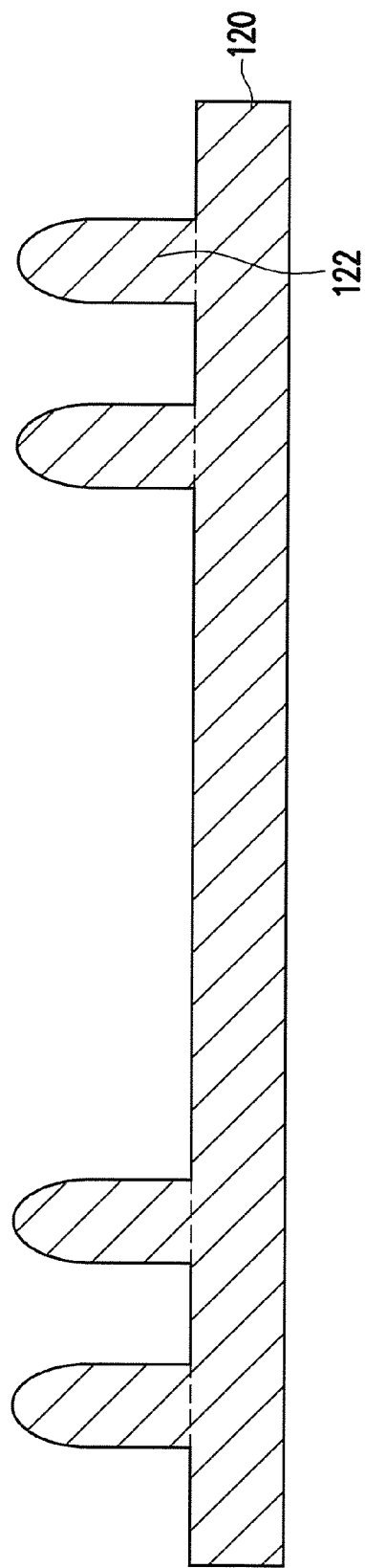

FIGS. 1A to 1E are schematic diagrams illustrating a flow chart of an encapsulation method of an environmental sensitive element according to an exemplary embodiment. Referring to FIG. 1A, an encapsulation method of an environmental sensitive element of the present exemplary embodiment includes the following. An environmental sensitive element 130 is formed on a first substrate 110. The first substrate 110 is, for example, a flexible substrate made of polyethylene terephthalate (PET), polyethylene naphthalene (PEN), polyethersulfone (PES), polymethylmethacrylate (PMMA), polycarbonate (PC), polyimide (PI), or metal foil. The flexible substrate can also be a substrate having a touch screen function, for example, a surface capacitive touch screen, a digital matrix touch screen (i.e. a projective capacitive touch screen), or an analogue matrix touch screen.

The environmental sensitive element 130 is, for instance, an active environmental sensitive element display device or a passive environmental sensitive element display device. Here, the active environmental sensitive element display device is, for example, an active matrix organic light emitting diode (AM-OLED), an active matrix electrophoretic display (AM-EPD), the so-called electronic paper, an active matrix liquid crystal display (AM-LCD), or an active matrix blue phase liquid crystal display. The passive environmental sensitive element display device is, for example, a passive matrix organic light emitting diode (PM-OLED) or a super twisted nematic liquid crystal display (STN-LCD).

Referring to FIG. 1B, a substrate 120a is provided. The substrate 120a is made of stainless steel, glass, or plastic, for example.

Referring to FIG. 1C, for instance, when the substrate 120a is made of stainless steel or glass, an etching process is performed to the substrate 120 to form a second substrate 120 and a plurality of first barrier structures 122 located on the second substrate 120. When the substrate 120a is made of plastic, a molding process or a pressing process is performed to the substrate 120a to form the second substrate 120 and the first barrier structures 122 located on the second substrate 120. That is, the first barrier structures 122 and the second substrate 120 of the present exemplary embodiment are integrally formed and made of the same material. It should be illustrated that in the present exemplary embodiment, the substrate 120a shown in FIG. 1C is made of stainless steel as an example.

Notably, the present exemplary embodiment does not limit the number of the first barrier structures 122. However, two first barrier structures 122 are mentioned herein. In other exemplary embodiments not illustrated here, the number of the first barrier structures 122 can be more or less depending on demands. That is, the number of the first barrier structures can be one or more than two. As long as the number of the first barrier structures 122 is capable of attaining the structural design for vapor and oxygen resistance, and the number of the first barrier structures 122 is applicable to the technology of the disclosure and does not depart from the protection scope of the disclosure.

Figure 1D:
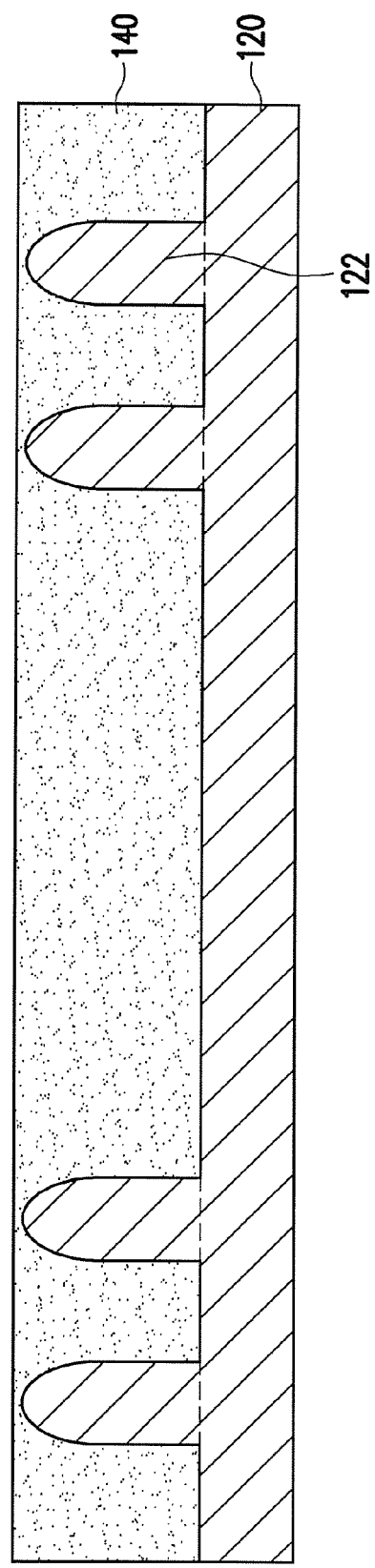

Referring to FIG. 1D, an adhesive 140 is formed on the second substrate 120. The adhesive 140 encapsulates or covers the first barrier structures 122. In the present exemplary embodiment, the adhesive 140 is made of olefin, urethane, acrylic or epoxy, for instance. The adhesive 140 is a pressure-sensitive material or an adhesive material, for instance. In an embodiment, an outgassing of the adhesive 140 under 120 degrees Celsius is, for example, less than or equal to $5\times10^{-7}$ gram/cm$^2$. In some embodiments, the outgassing of the adhesive 140 under 120 degrees Celsius ranges from $5\times10^{-8}$ gram/cm$^2$ to $5\times10^{-7}$ gram/cm$^2$. The adhesive 140 may be a thermo-setting adhesive with low outgassing characteristics. It is noted that, the adhesive 140 may be a single layered adhesive or a multi-layered adhesive. In some embodiments, the adhesive 140 may be formed by a material having constant outgassing. In some alternative embodiments, the adhesive 140 may be a grading layer whose outgassing increases gradually from a first side near the environmental sensitive element 130 to a second side opposite to the first side.

In an embodiment, the volume shrinkage of the adhesive 140 may be less than or equal to 5%, water absorption of the adhesive 140 may be less than or equal to 0.1% (24 hours in water), the thickness of the adhesive 140 may range from about 1 micrometer to about 100 micrometers, and the refractive index of the adhesive 140 may range from about 1.4 to about 2.5.

Figure 1E:
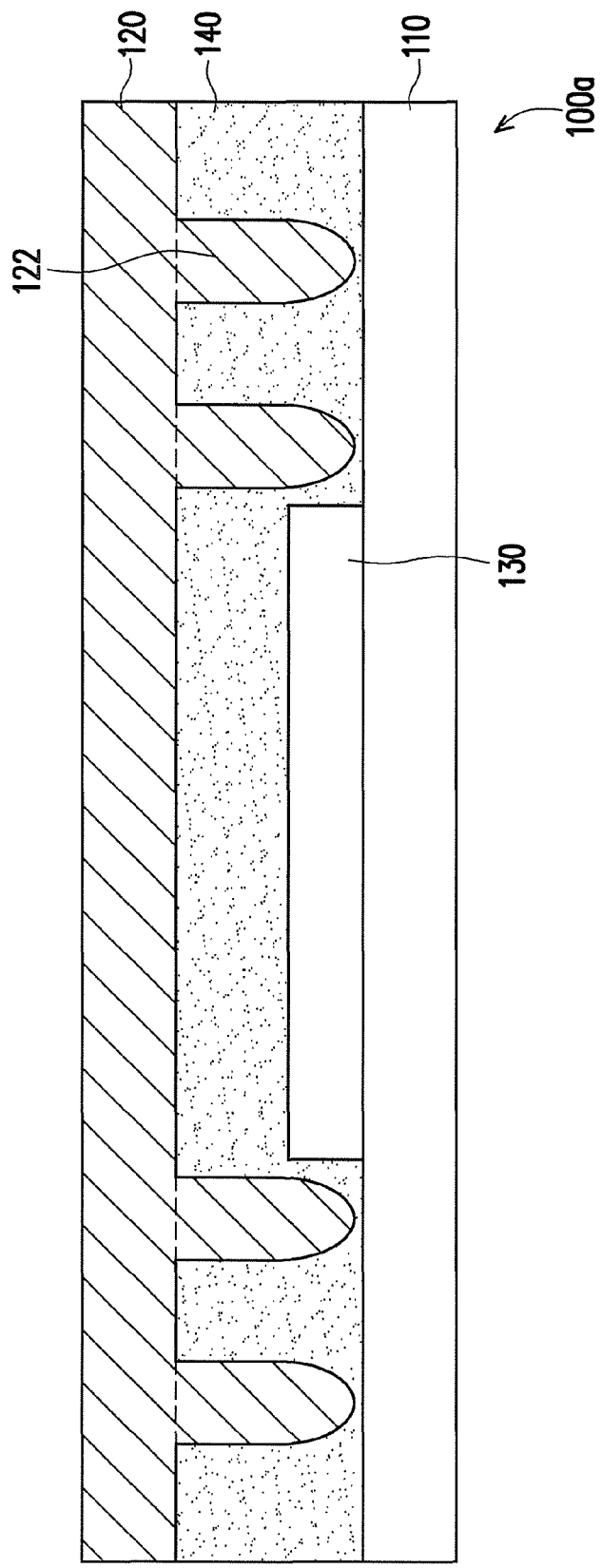
Figure 1E:
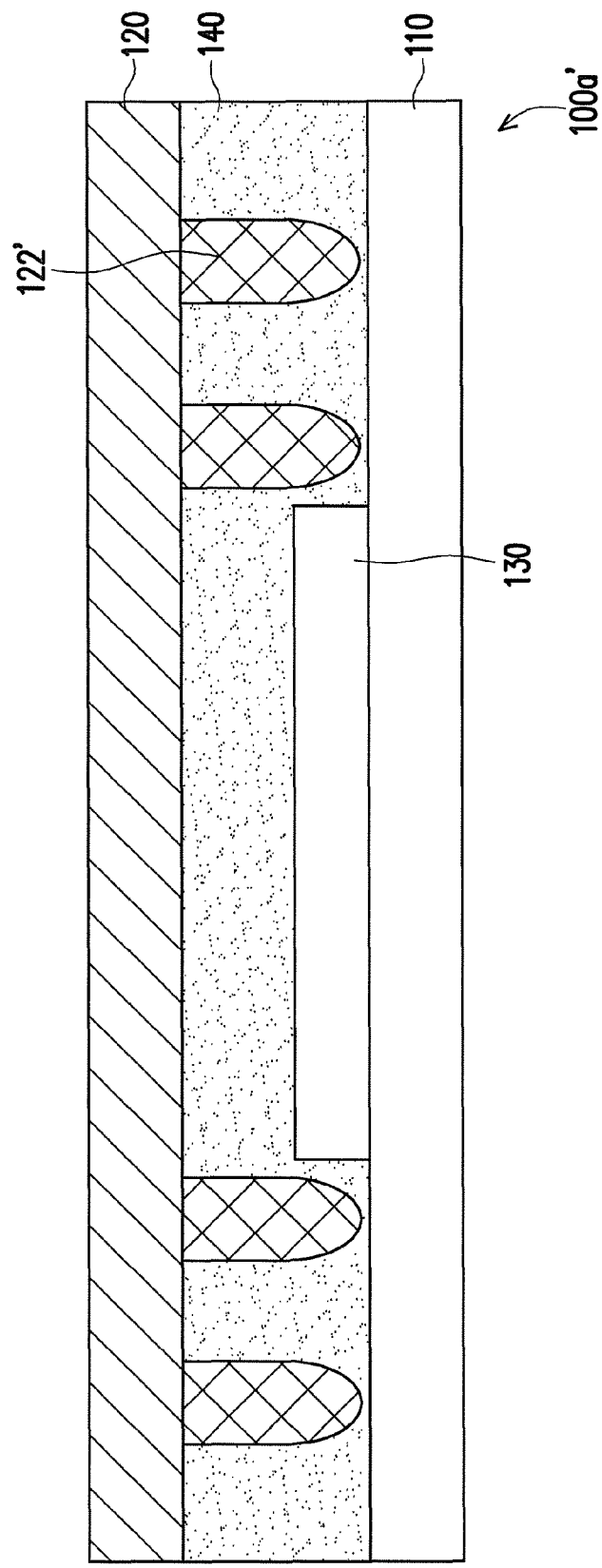

Referring to FIG. 1E, the second substrate 120 is pressed onto the first substrate 110, so that the second substrate 120 is adhered to the first substrate 110 through the adhesive 140. In some alternative embodiments, a thin film encapsulation (not shown) may be optionally formed to encapsulate the environmental sensitive element 130 on the first substrate 110. The first barrier structures 122 are distributed outside or surround the environmental sensitive element 130. The adhesive 140 covers the environmental sensitive element 130. Up to this point, the manufacture of a package 100 of an environmental sensitive element is completed.

In short, the encapsulation method of the environmental sensitive element in the present exemplary embodiment adopts stainless steel, glass, or plastic in the integrally formed second substrate 120 and the first barrier structures 122. Here, stainless steel or glass can have superior vapor and oxygen resistance, and the first barrier structures 122 are distributed outside or surround the environmental sensitive element 130. Thus, the package 100a of the environmental sensitive element adopting the method of the present exemplary embodiment has superior vapor and oxygen resistance and can extend the lifespan of the environmental sensitive element 130 effectively.

The manufacture depicted in FIGS. 1A to 1E merely illustrates an example and some steps therein are common techniques applied in conventional packaging processes. Thus, persons skilled in the art can adjust, omit, or add steps according to actual circumstances to satisfy manufacturing demands, and the details are not repeated hereinafter.

Several exemplary embodiments are presented below to describe an environmental sensitive element package and a manufacturing method thereof. The exemplary embodiments provided below adopt notations and partial content of the exemplary embodiment aforementioned. Herein, identical notations are used to denote identical or similar elements and the description of identical technology is omitted. The omitted part can be referred to the above exemplary embodiment and is not repeated hereinafter.

FIG. 1E' is a schematic cross-sectional view of an environmental sensitive element package according to an alternative exemplary embodiment. Referring to FIG. 1E', in an alternative embodiment, the first barrier structures 122' of the package 100a' of the environmental sensitive element is formed on the second substrate 120 and protrudes from the second substrate 120 toward the first substrate 110. The first barrier structures 122' and the second substrate 120 may be made of different materials. In other words, the first barrier structures 122' and the second substrate 120 in FIG. 1E' are not formed integrally. Formation of the first barrier structures 122' includes thin-film processes, for example.

Figure 2:
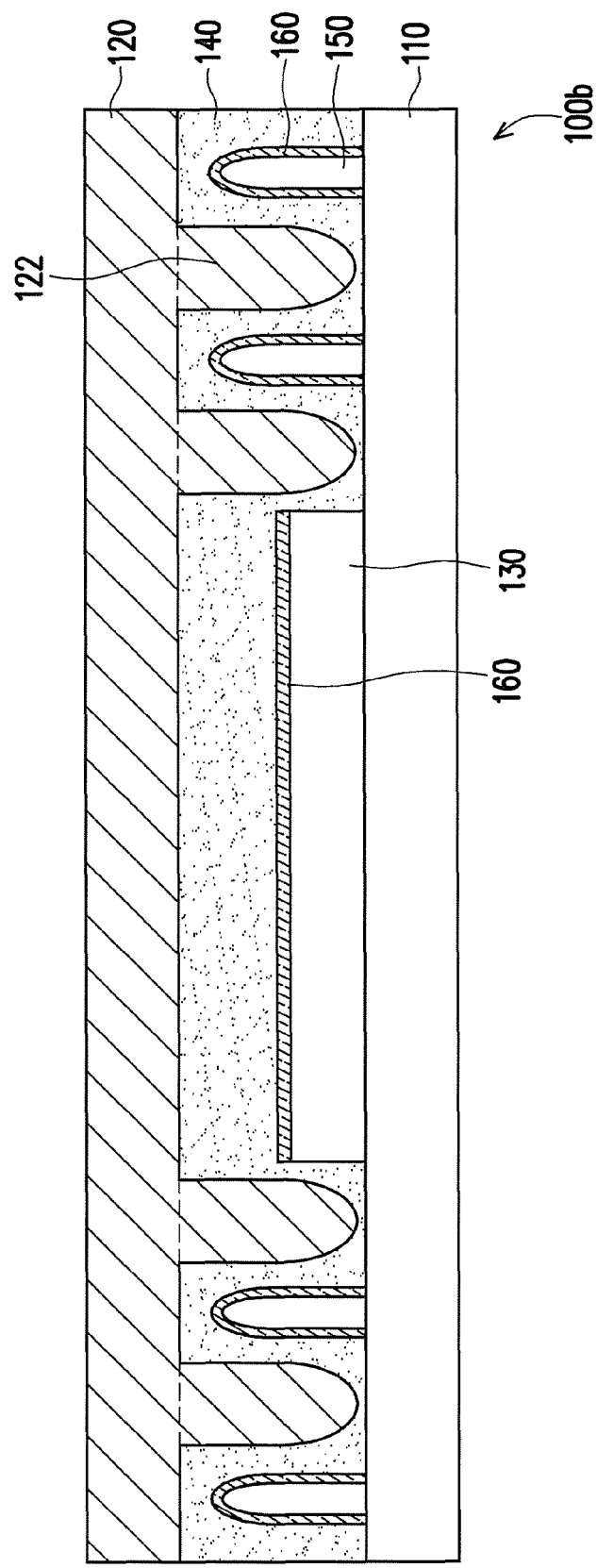
FIG. 2 is a schematic cross-sectional view of an environmental sensitive element package according to an exemplary embodiment.

FIG. 2 is a schematic cross-sectional view of an environmental sensitive element package according to an exemplary embodiment. Referring to FIG. 2, a package 100b of an environmental sensitive element of FIG. 2 is similar to the package 100a of the environmental sensitive element of FIG. 1E. The difference between the two is that the package 100b of the environmental sensitive element in FIG. 2 further includes a plurality of second barrier structures 150 and a first passivation layer 160.

In details, in the present exemplary embodiment, the second barrier structures 150 are disposed on the first substrate 110 and distributed outside the environmental sensitive element 130. The second barrier structures 150 and the first barrier structures 122 are arranged alternately. The first passivation layer 160 is disposed on the environmental sensitive element 130 and the second barrier structures 150. The first passivation layer 160 covers the second barrier structures 150 and is made of silicon nitride (SiNx), silicon oxide (SiOx), aluminum (Al), aluminum oxide ($Al_2O_3$), molybdenum oxide ($MoO_3$), or tungsten oxide ($WO_3$). As the first passivation layer 160 of the present exemplary embodiment covers the second barrier structures 150, the vapor and oxygen resistance of the package 100b of the environmental sensitive element is enhanced and the lifespan of the environmental sensitive element 130 is extended effectively.

As for the manufacture, the package 100b of the environmental sensitive element of the present exemplary embodiment adopts a manufacturing method similar to that of the package 100a of the environmental sensitive element in FIG. 1E. After the step illustrated in FIG. 1A, that is, after the environmental sensitive element 130 is formed on the first substrate 110, the second barrier structures 150 are formed on the first substrate 110. The passivation layer 160 is simultaneously formed on the environmental sensitive element 130 and the second barrier structures 150. The manufacture of the package 100a of the environmental sensitive element is generally completed after the steps in FIGS. 1B to 1E have been sequentially performed.

Figure 3:
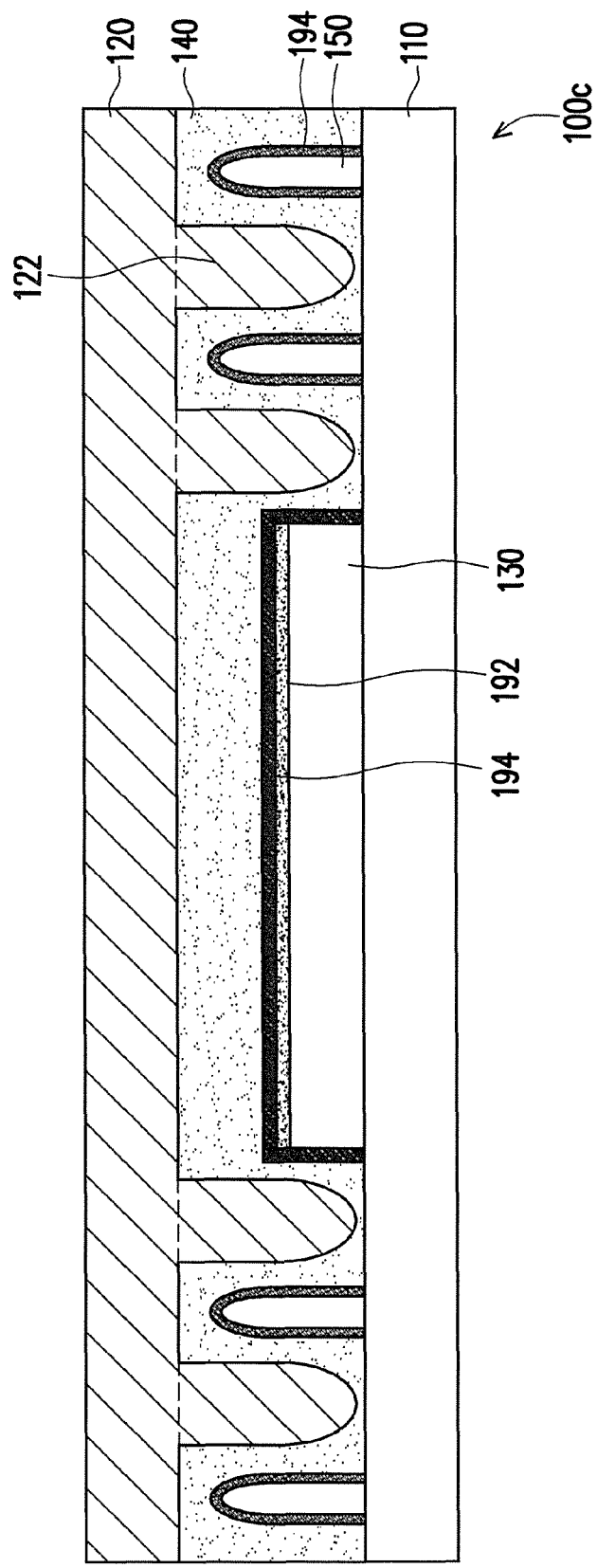
FIG. 3 is a schematic cross-sectional view of an environmental sensitive element package according to another exemplary embodiment.
Figure 3:
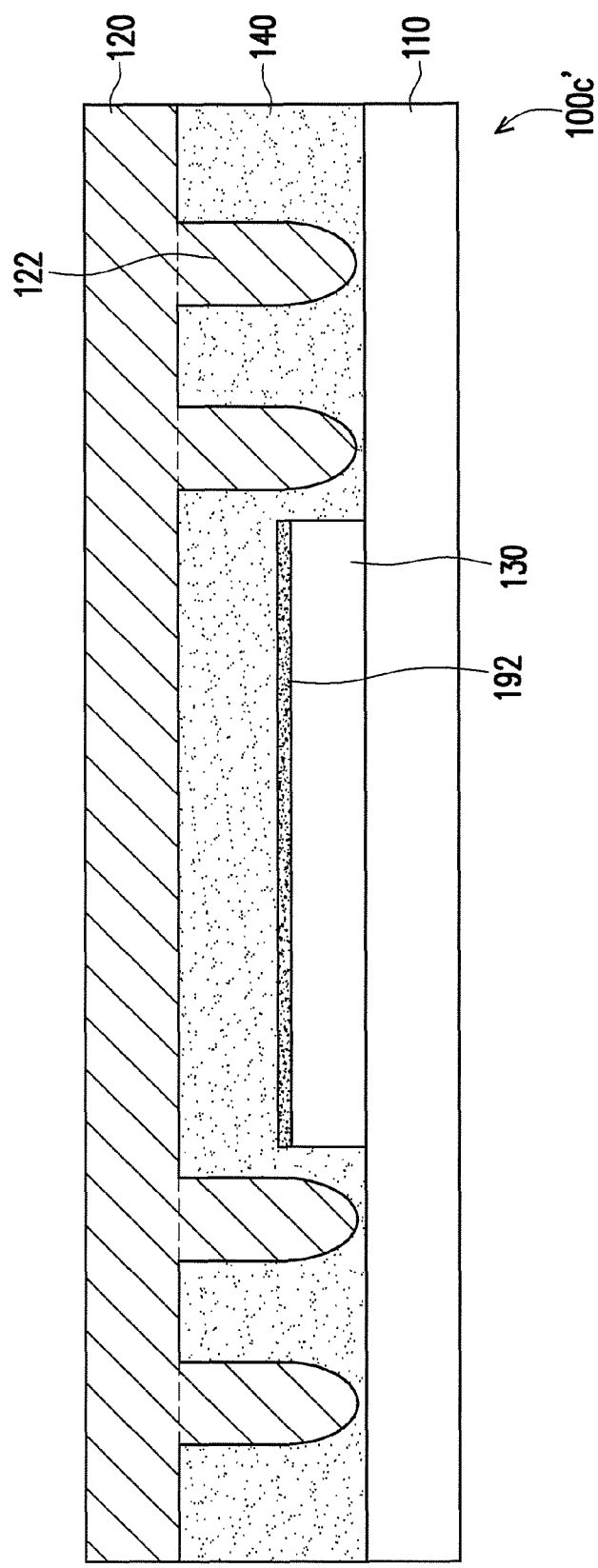

FIG. 3 is a schematic cross-sectional view of an environmental sensitive element package according to another exemplary embodiment. Referring to FIG. 3, a package 100c of an environmental sensitive element in FIG. 3 is similar to the package 100a of the environmental sensitive element in FIG. 1E. The difference is that the package 100c of the environmental sensitive element in FIG. 3 further includes a plurality of second barrier structures 150 and a flexible buffer layer 192. The flexible buffer layer 192 is made of small molecular compounds, oligomers, metals, or organic-inorganic co-steaming materials, for example. The molecular weight of the small molecular compounds approximately ranges from 10 g/mol to 5,000 g/mol. The small molecular compounds include, for example, Tris-(8-hydroxyquinoline) aluminum, alpha-NPB, N,N'-Dis(naphthalene-1-yl)-N,N'-diphenyl-benzidine, CuPc Phalocyanine, and copper complex. The molecular weight of the oligomers approximately ranges from 500 g/mol to 9,000 g/mol. The oligomers include phenylene vinylene oligomers, and fluorine oligomers, for instance. The molecular weight of the metal or organic-inorganic co-steaming materials ranges from 3 g/mol to 500 g/mol. A flexible passivation layer 194 is further included. The flexible passivation layer 194 is made of, for instance, indium tin oxide (ITO), indium zinc oxide (IZO), aluminum doped zinc oxide (AZO), tungsten oxide ($WO_3$), molybdenum oxide ($MoO_3$), silicon oxide (SiOx), silicon nitride (SiNx), silicon oxynitride ($SiO_xN_y$), aluminum oxide ($Al_2O_3$), aluminum (Al), argentum (Ag), magnesium-argentum (Mg—Ag), or magnesium-aluminum (Mg—Al).

In details, in the present exemplary embodiment, the second barrier structures 150 are disposed on the first substrate 110 and distributed outside the environmental sensitive element 130. The second barrier structures 150 and the first barrier structures 122 are arranged alternately. The flexible buffer layer 192 is disposed on the environmental sensitive element 130. The flexible passivation layer 194 is disposed on the flexible buffer layer 192 and the second barrier structures 150. The flexible buffer layer 192 is located between the environmental sensitive element 130 and the flexible passivation layer 194. The flexible passivation layer 194 covers the second barrier structures 150. In some embodiments, the outgassing of the flexible buffer layer 192 under 120 degrees Celsius is less than the outgassing of the adhesive 140 under 120 degrees Celsius. For example, the outgassing of the flexible buffer layer 192 under 120 degrees Celsius is less than $5 \times 10^{-8}$ gram/cm$^2$.

As for the manufacture, the package 100c of the environmental sensitive element of the present exemplary embodiment adopts a manufacturing method similar to that of the package 100a of the environmental sensitive element in FIG. 1E. After the step illustrated in FIG. 1A, that is, after the environmental sensitive element 130 is formed on the first substrate 110, the second barrier structures 150 are formed on the first substrate 110. The flexible buffer layer 192 is disposed on the environmental sensitive element 130. The flexible passivation layer 194 is simultaneously formed on the flexible buffer layer 192 and the second barrier structures 150. The manufacture of the package 100c of the environmental sensitive element is generally completed after the steps in FIGS. 1B to 1E have been sequentially performed.

In the present exemplary embodiment, the flexible buffer layer 192 is manufactured on the environmental sensitive element 130. Thus, when the environmental sensitive element 130 is flexed, the film peeling phenomenon results in the flexible buffer layer 192. As a consequence, the film peeling resulted from the flexed environmental sensitive element 130 is improved, such that the light emitting structure is prevented from being damaged when the element is flexed. The product yield is therefore enhanced effectively. In addition, as the flexible passivation layer 194 of the present exemplary embodiment covers the second barrier structures 150, the vapor and oxygen resistance of the package 100c of the environmental sensitive element is enhanced and the lifespan of the environmental sensitive element 130 is extended effectively.

FIG. 3' is a schematic cross-sectional view of an environmental sensitive element package according to another exemplary embodiment. Referring to FIG. 3 and FIG. 3', a package 100c' of an environmental sensitive element in FIG. 3' is similar to the package 100c of the environmental sensitive element in FIG. 3. The difference is that the package 100c' of the environmental sensitive element in FIG. 3' does not include the second barrier structures 150 and the flexible passivation layer 194 illustrated in FIG. 3.

In FIG. 3', the flexible buffer layer 192 is formed on and covers a top surface of the environmental sensitive element 130, for example. In some alternative embodiments, the flexible buffer layer 192 may further extend to cover sidewalls of the environmental sensitive element 130 and/or the first substrate 110. In some embodiments, the outgassing of the flexible buffer layer 192 under 120 degrees Celsius is less than the outgassing of the adhesive 140 under 120 degrees Celsius. For example, the outgassing of the flexible buffer layer 192 under 120 degrees Celsius is less than $5 \times 10^{-8}$ gram/cm$^2$.

FIG. 3" is a schematic cross-sectional view of an environmental sensitive element package according to another exemplary embodiment. Referring to FIG. 3 and FIG. 3", a package 100c" of an environmental sensitive element in FIG. 3" is similar to the package 100c of the environmental sensitive element in FIG. 3. The difference is that the package 100c" of the environmental sensitive element in FIG. 3" does not include the second barrier structures 150 illustrated in FIG. 3. Furthermore, the flexible passivation layer 194 does not cover the second barrier structures 150 because the second barrier structures 150 (shown in FIG. 3) are omitted.

In FIG. 3", the flexible buffer layer 192 is formed on and covers a top surface of the environmental sensitive element 130 while the flexible passivation layer 194 is formed on and covers the flexible buffer layer 192, for example. In some alternative embodiments, the flexible passivation layer 194 may further extend to cover sidewalls of the environmental sensitive element 130 and/or the first substrate 110. In some embodiments, the outgassing of the flexible buffer layer 192 under 120 degrees Celsius is less than the outgassing of the adhesive 140 under 120 degrees Celsius. For example, the outgassing of the flexible buffer layer 192 under 120 degrees Celsius is less than $5 \times 10^{-8}$ gram/cm$^2$.

Figure 4:
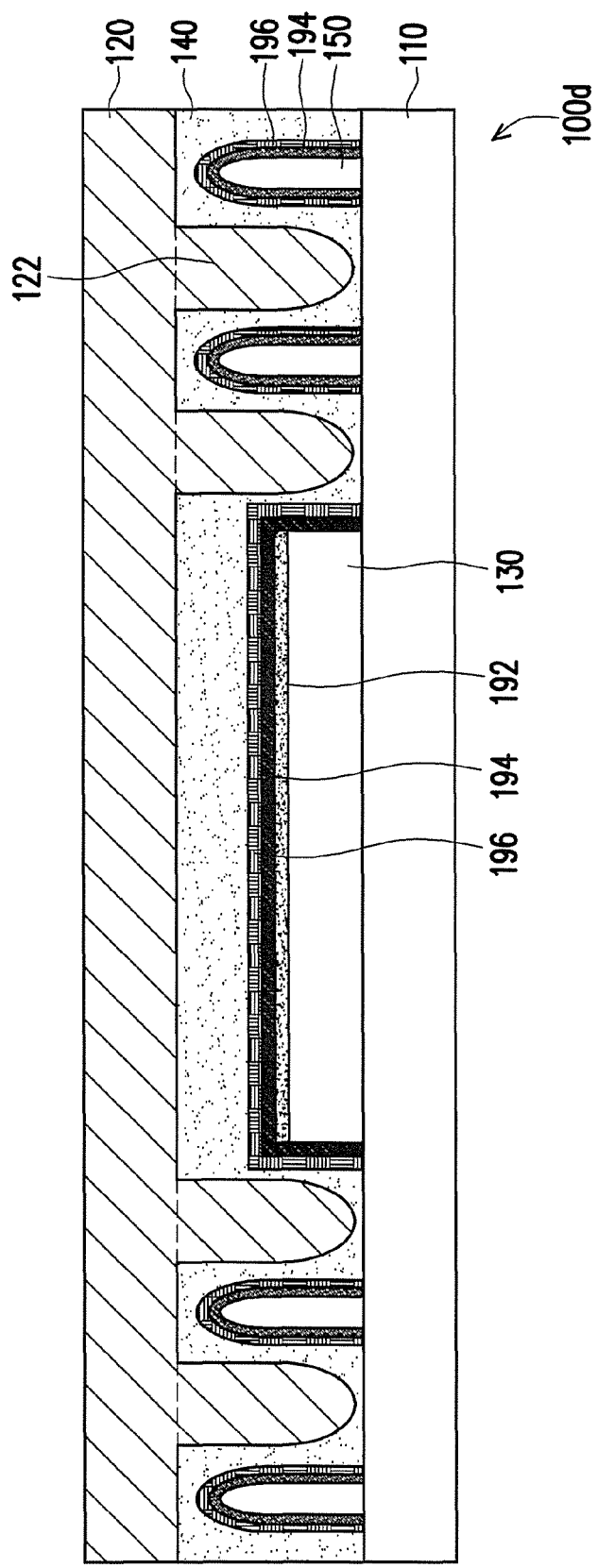
FIG. 4 is a schematic cross-sectional view of an environmental sensitive element package according to another exemplary embodiment.
Figure 4:
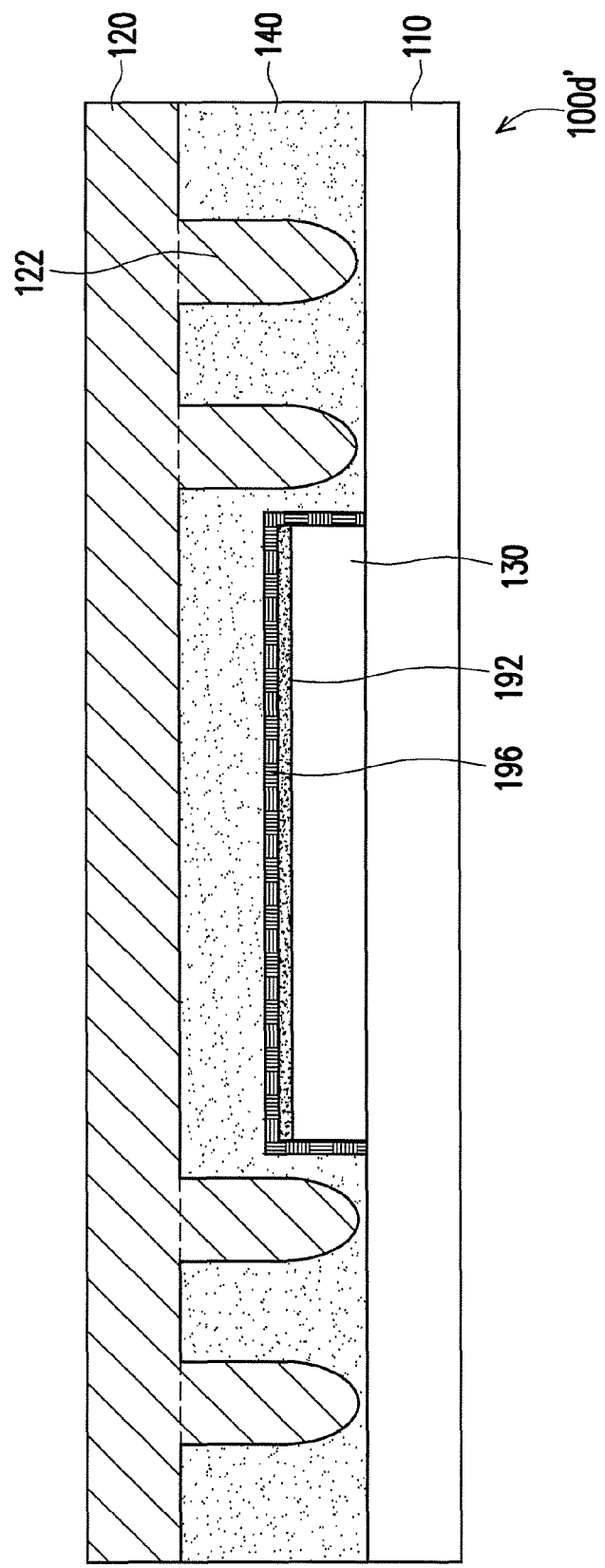

FIG. 4 is a schematic cross-sectional view of an environmental sensitive element package according to another exemplary embodiment. Referring to FIG. 4, a package 100d of an environmental sensitive element of FIG. 4 is similar to the package 100c of the environmental sensitive element of FIG. 3. The difference between the two is that the package 100d of the environmental sensitive element in FIG. 4 further includes a plurality of passivation films 196 (e.g. thin film encapsulation). The passivation films 196 are disposed on the flexible passivation layer 194. The passivation films 196 cover the flexible passivation layer 194 located on the second barrier structures 150. As the second barrier structures 150 are covered by the passivation films 196 and the flexible passivation layer 194, the vapor and oxygen resistance of the package 100d of the environmental sensitive element is enhanced and the lifespan of the environmental sensitive element 130 is extended effectively.

As for the manufacture, the package 100d of the environmental sensitive element of the present exemplary embodiment adopts a manufacturing method similar to that of the package 100c of the environmental sensitive element in FIG. 3. After the flexible passivation layer 194 is simultaneously formed on the flexible buffer layer 192 and the second barrier structures 150, the passivation films 196 are formed on the flexible passivation layer 194 at the same time. The passivation films 196 cover a portion of the flexible passivation layer 194 located on the second barrier structures 150. The manufacture of the package 100d of the environmental sensitive element is generally completed after the steps in FIGS. 1B to 1E have been sequentially performed. In some embodiments, the outgassing of the flexible buffer layer 192 under 120 degrees Celsius is less than the outgassing of the adhesive 140 under 120 degrees Celsius. For example, the outgassing of the flexible buffer layer 192 under 120 degrees Celsius is less than $5 \times 10^{-8}$ gram/cm$^2$.

FIG. 4' is a schematic cross-sectional view of an environmental sensitive element package according to another exemplary embodiment. Referring to FIG. 4 and FIG. 4', a package 100d' of an environmental sensitive element in FIG. 4' is similar to the package 100d of the environmental sensitive element in FIG. 4. The difference is that the package 100d' of the environmental sensitive element in FIG. 4' does not include the second barrier structures 150 and the flexible passivation layer 194 illustrated in FIG. 4. Furthermore, the passivation films 196 do not cover the second barrier structures 150 because the second barrier structures 150 (shown in FIG. 4) are omitted.

In FIG. 4', the flexible buffer layer 192 is formed on and covers a top surface of the environmental sensitive element 130 while the passivation films 196 are formed on and covers the flexible buffer layer 192, for example. In some alternative embodiments, the passivation films 196 may further extend to cover sidewalls of the environmental sensitive element 130 and/or the first substrate 110. In some embodiments, the outgassing of the flexible buffer layer 192 under 120 degrees Celsius is less than the outgassing of the adhesive 140 under 120 degrees Celsius. For example, the outgassing of the flexible buffer layer 192 under 120 degrees Celsius is less than $5 \times 10^{-8}$ gram/cm$^2$.

Figure 5:
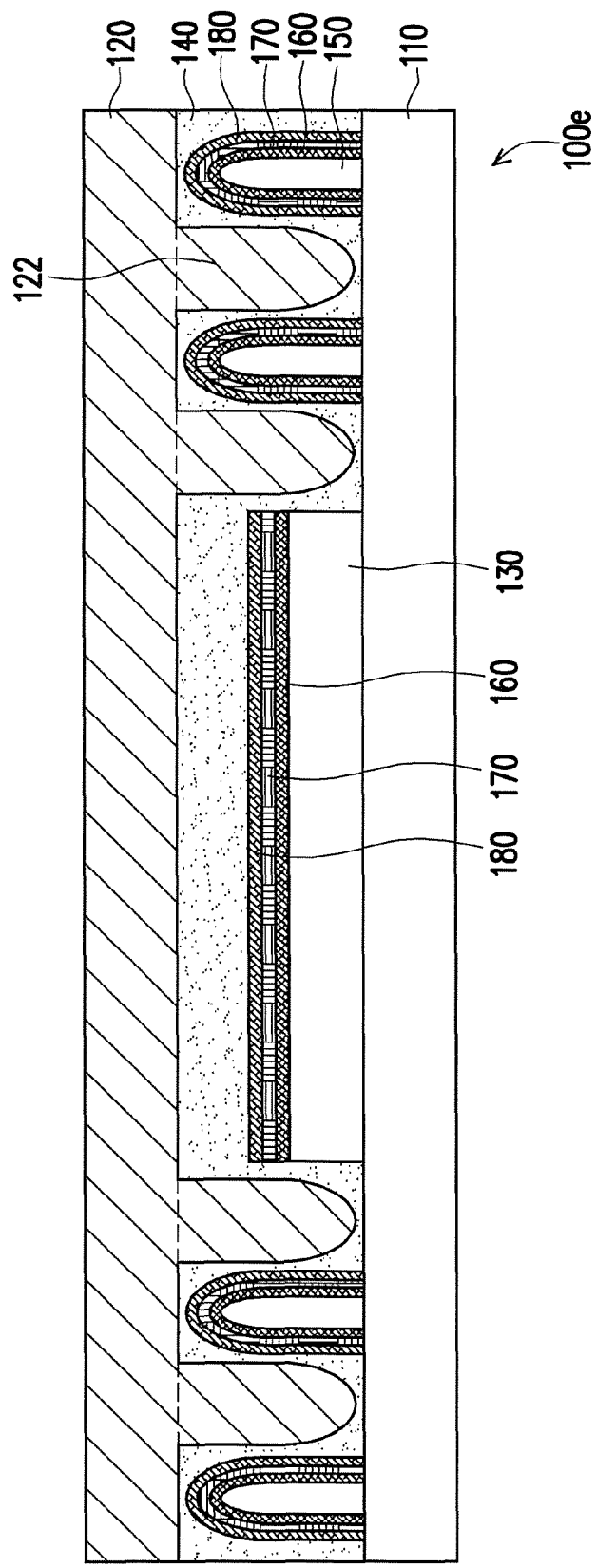
FIG. 5 is a schematic cross-sectional view of an environmental sensitive element package according to another exemplary embodiment.

FIG. 5 is a schematic cross-sectional view of an environmental sensitive element package according to another exemplary embodiment. Referring to FIG. 5, a package 100e of an environmental sensitive element of FIG. 5 is similar to the package 100a of the environmental sensitive element of FIG. 1E. The difference between the two is that the package 100e of the environmental sensitive element in FIG. 5 further includes a plurality of second barrier structures 150, a first passivation layer 160, an absorbent layer 170, and a second passivation layer 180.

In details, in the present exemplary embodiment, the second barrier structures 150 are disposed on the first substrate 110 and distributed outside the environmental sensitive element 130. The second barrier structures 150 and the first barrier structures 122 are arranged alternately. The first passivation layer 160 is disposed on the environmental sensitive element 130 and the second barrier structures 150. The first passivation layer 160 covers the second barrier structures 150. The absorbent layer 170 is disposed on the first passivation layer 160. The absorbent layer 170 covers the first passivation layer 160 located on the environmental sensitive element 130 and the first passivation layer 160 located on the second barrier structures 150. The second passivation layer 180 is disposed on the absorbent layer 170. The absorbent layer 170 is located between the first passivation layer 160 and the second passivation layer 180.

In short, the second barrier structures 150 of the present exemplary embodiment are covered with the first passivation layer 160, the absorbent layer 170, and the second passivation layer 180 sequentially. As the second barrier structures 150 of the present exemplary embodiment are sequentially covered with the first passivation layer 160, the absorbent layer 170, and the second passivation layer 180, the vapor and oxygen resistance of the package 100e of the environmental sensitive element is enhanced and the lifespan of the environmental sensitive element 130 is extended effectively.

As for the manufacture, the package 100e of the environmental sensitive element of the present exemplary embodiment adopts a manufacturing method similar to that of the package 100a of the environmental sensitive element in FIG. 1E. After the step illustrated in FIG. 1A, that is, after the environmental sensitive element 130 is formed on the first substrate 110, the second barrier structures 150 are formed on the first substrate 110. The first passivation layer 160 is simultaneously formed on the environmental sensitive element 130 and the second barrier structures 150. The absorbent layer 170 is formed on the first passivation layer 160. The second passivation layer 180 is disposed on the absorbent layer 170. The absorbent layer 170 is located between the first passivation layer 160 and the second passivation layer 180. The manufacture of the package 100e of the environmental sensitive element is generally completed after the steps in FIGS. 1B to 1E have been sequentially performed.

As shown in FIG. 5, in some alternative embodiments, formation of the second barrier structures 150 may be omitted based on actual design requirements. In other words, the first passivation layer 160, the absorbent layer 170, and the second passivation layer 180 do not cover the second barrier structures 150 because the second barrier structures 150 are omitted.

Figure 6A:
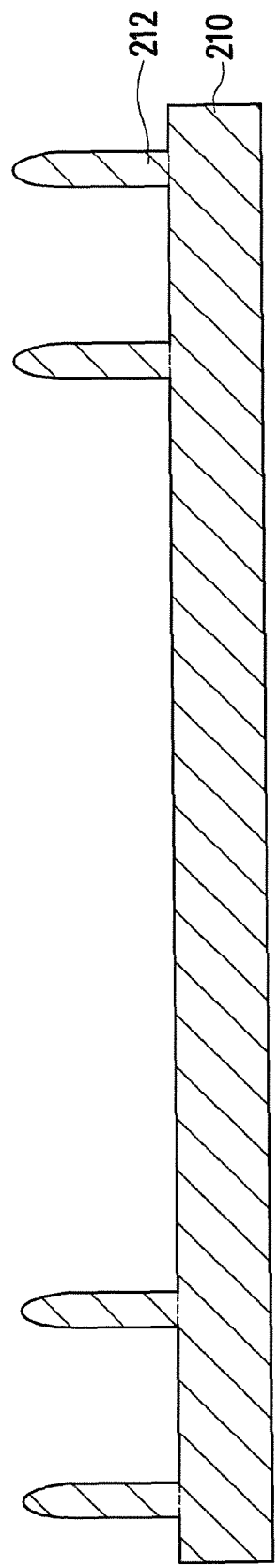
FIGS. 6A to 6D are schematic diagrams illustrating a flow chart of an encapsulation method of an environmental sensitive element according to an exemplary embodiment.

FIGS. 6A to 6D are schematic diagrams illustrating a flow chart of an encapsulation method of an environmental sensitive element according to an exemplary embodiment. Referring to FIG. 6A, an encapsulation method of an environmental sensitive element of the present exemplary embodiment includes the following. A first substrate 210 and a first barrier structure 212 that are integrally formed are provided. The first barrier structure 212 and the first substrate 210 are substantially made of a same material, such as stainless steel, glass, or plastic.

In the present exemplary embodiment, when the first substrate 210 is made of stainless steel or glass, the step of forming the first substrate 210 and the first barrier structure 212 includes the following. For example, a substrate (not illustrated) is provided. An etching process is performed to the substrate to form the first substrate 210 and a plurality of first barrier structures 212 located on the first substrate 210. When the first substrate 210 is made of plastic, the step of forming the first substrate 210 and the first barrier structure 212 includes the following. For example, a substrate (not illustrated) is provided. A molding process or a pressing process is performed to the substrate to form the first substrate 210 and a plurality of first barrier structures 212 located on the first substrate 210.

Figure 6B:
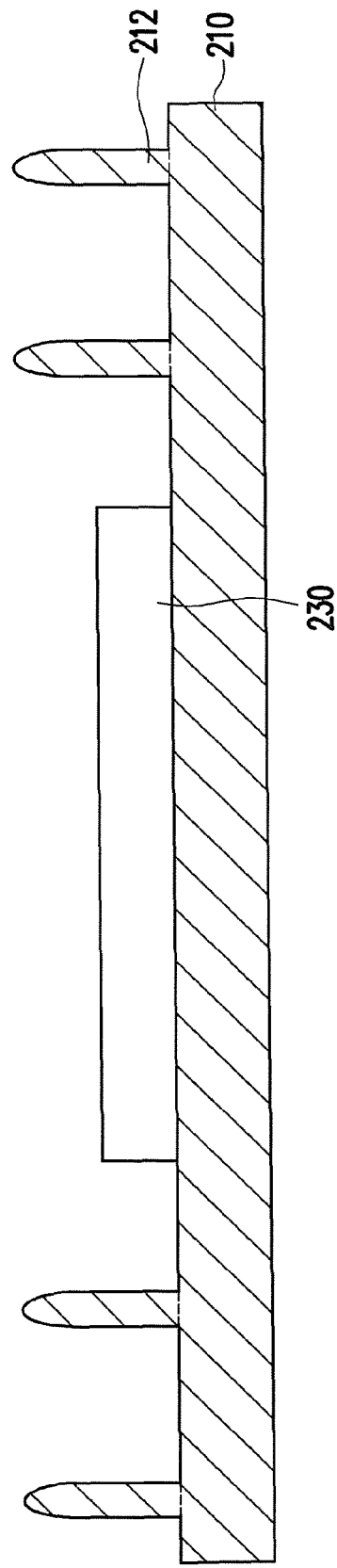

Referring to FIG. 6B, an environmental sensitive element 230 is formed on the first substrate 210, where the first barrier structures 212 distributed outside the environmental sensitive element 230. In the present exemplary embodiment, the environmental sensitive element 230 is, for instance, an active environmental sensitive element display device or a passive environmental sensitive element display device. Here, the active environmental sensitive element display device is, for example, an AM-OLED, an AM-EPD, the so-called electronic paper, an AM-LCD, or an active matrix blue phase liquid crystal display. The passive environmental sensitive element display device is, for example, a PM-OLED or a STN-LCD.

Figure 6C:
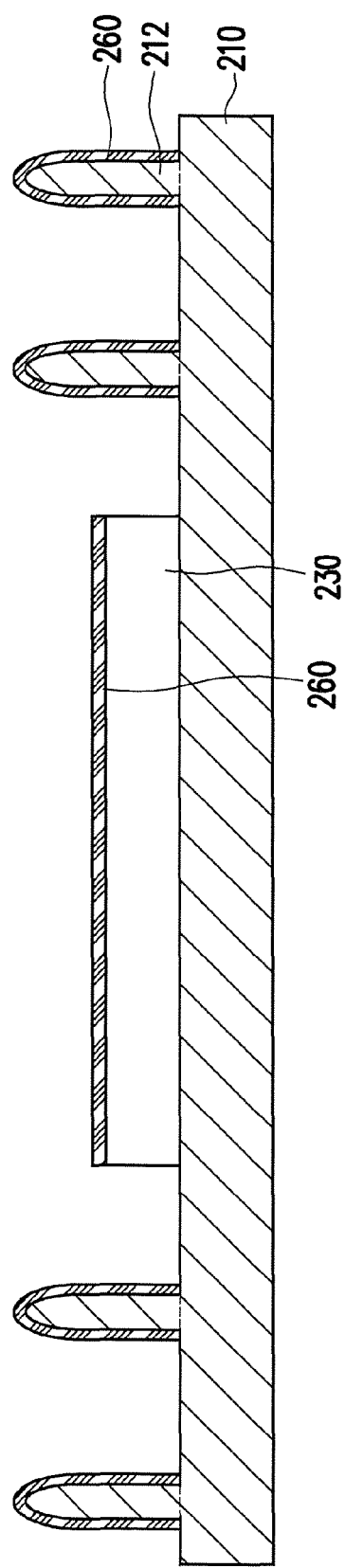

Referring to FIG. 6C, a first passivation layer 260 is formed on the environmental sensitive element 230 and the first barrier structures 212. The first passivation layer 230 covers the first barrier structures 212. In the present exemplary embodiment, the first passivation layer 230 is made of silicon nitride (SiNx), silicon oxide (SiOx), aluminum (Al), aluminum oxide ($Al_2O_3$), molybdenum oxide ($MoO_3$), or tungsten oxide ($WO_3$).

Figure 6D:
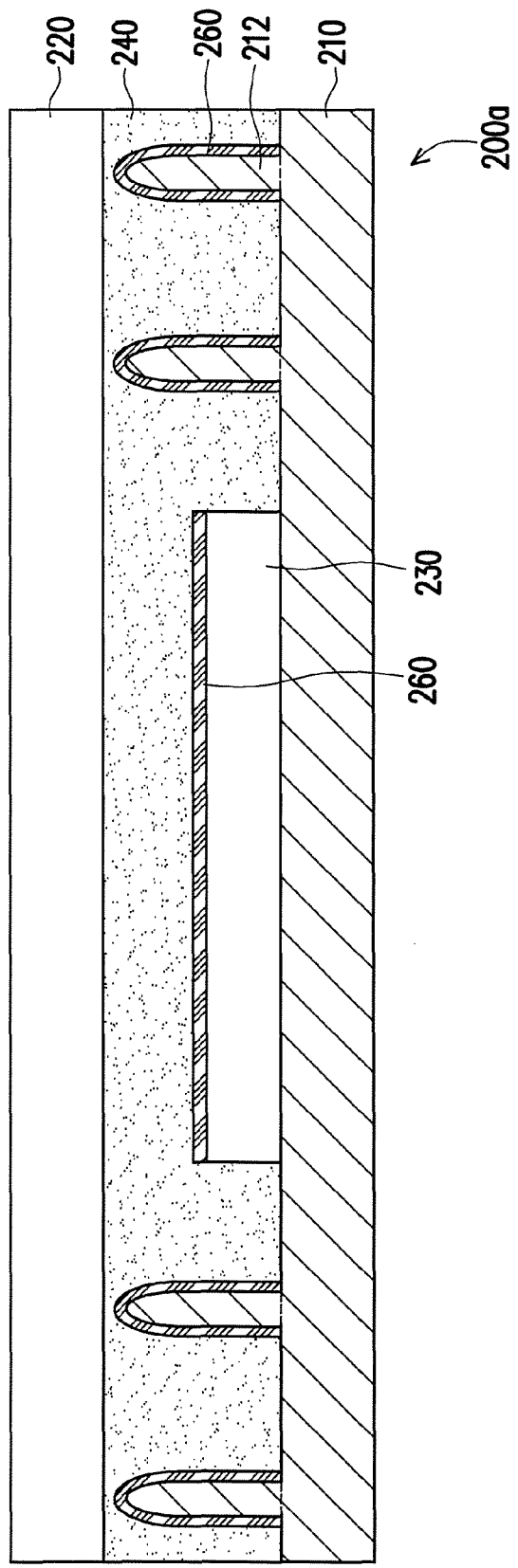

Referring to FIG. 6D, an adhesive 240 is formed on the first substrate 210. The adhesive 240 covers the environmental sensitive element 230 and the first barrier structures 212. In the present exemplary embodiment, the adhesive 240 is made of olefin, urethane, acrylic or epoxy, for instance. The adhesive 240 is a pressure-sensitive material or an adhesive material, for instance. In an embodiment, an outgassing of the adhesive 240 under 120 degrees Celsius is, for example, less than or equal to $5 \times 10^{-7}$ gram/cm². The adhesive 240 may be a thermo-setting adhesive with low outgassing characteristics. It is noted that, the adhesive 240 may be a single layered adhesive or a multi-layered adhesive. In some embodiments, the adhesive 240 may be formed by a material having constant outgassing. In some alternative embodiments, the adhesive 240 may be a grading layer whose outgassing increases gradually from a first side near the environmental sensitive element 230 to a second side opposite to the first side.

In an embodiment, the volume shrinkage of the adhesive 240 may be less than or equal to 5%, water absorption of the adhesive 240 may be less than or equal to 0.1% (24 hours in water), the thickness of the adhesive 240 may range from about 1 micrometer to about 100 micrometers, and the refractive index of the adhesive 240 may range from about 1.4 to about 2.5.

Referring to FIG. 6D, a second substrate 220 is provided on the first substrate 210. The second substrate 220 is pressed onto the adhesive 240. The second substrate 220 is adhered to the first substrate 210 through the adhesive 240.

In the present exemplary embodiment, the second substrate 220 is, for example, a flexible substrate made of PET, PEN, PES, PMMA, PC, PI, or metal foil. The flexible substrate can also be a substrate having a touch screen function, for example, a surface capacitive touch screen, a digital matrix touch screen (i.e. a projective capacitive touch screen), or an analogue matrix touch screen. Up to this point, the manufacture of a package 200a of an environmental sensitive element is completed.

In short, the encapsulation method of the environmental sensitive element in the present exemplary embodiment adopts stainless steel, glass, or plastic in the integrally formed first substrate 210 and the first barrier structures 212. Here, stainless steel or glass can have superior vapor and oxygen resistance, and the first barrier structures 212 are distributed outside the environmental sensitive element 230. Thus, the package 200a of the environmental sensitive element adopting the method of the present exemplary embodiment has superior vapor and oxygen resistance and can extend the lifespan of the environmental sensitive element 230 effectively.

The manufacture depicted in FIGS. 6A to 6D merely illustrates an example and some steps therein are common techniques applied in conventional packaging processes. Thus, persons skilled in the art can adjust, omit, or add steps according to actual circumstances to satisfy manufacturing demands, and the details are not repeated hereinafter.

Several exemplary embodiments are presented below to describe an environmental sensitive element package and a manufacturing method thereof. Notably, the exemplary embodiments provided below adopt notations and partial content of the exemplary embodiments aforementioned. Herein, identical notations are used to denote identical or similar elements and the description of identical technology is omitted. The omitted part can be referred to the above exemplary embodiment and is not repeated hereinafter.

Figure 7:
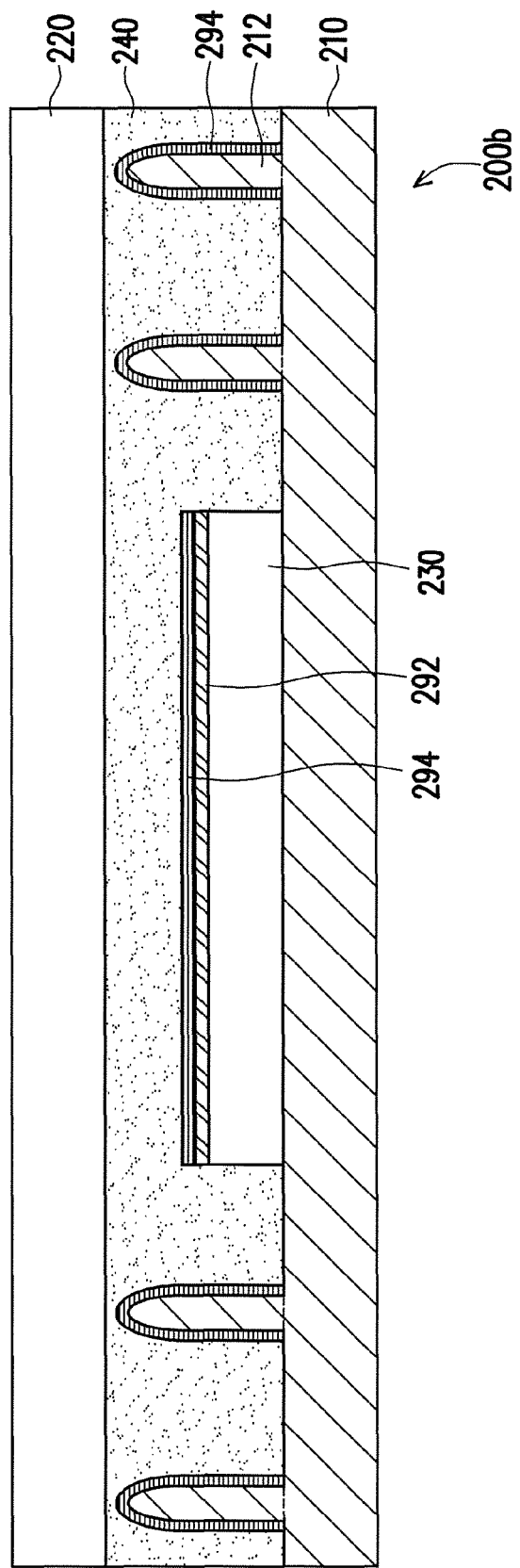
FIG. 7 is a schematic cross-sectional view of an environmental sensitive element package according to an exemplary embodiment.

FIG. 7 is a schematic cross-sectional view of an environmental sensitive element package according to an exemplary embodiment. Referring to FIG. 7, a package 200b of an environmental sensitive element of FIG. 7 is similar to the package 200a of the environmental sensitive element of FIG. 6D. The difference between the two is that the package 200b of the environmental sensitive element in FIG. 7 further includes a flexible buffer layer 292 and a flexible passivation layer 294.

In details, in the present embodiment, the flexible buffer layer 292 is disposed on the environmental sensitive element 230. The flexible passivation layer 294 is disposed on the flexible buffer layer 292 and the first barrier structures 212. The flexible buffer layer 292 is located between the environmental sensitive element 230 and the flexible passivation layer 294. The flexible passivation layer 294 covers the first barrier structures 212.

As for the manufacture, the package 200b of the environmental sensitive element of the present exemplary embodiment adopts a manufacturing method similar to that of the package 200a of the environmental sensitive element in FIG. 6D. After the step illustrated in FIG. 6B, that is, after the environmental sensitive element 230 is formed on the first substrate 210, the flexible buffer layer 292 is formed on the environmental sensitive element 230. The flexible passivation layer 294 is simultaneously formed on the flexible buffer layer 292 and the first barrier structures 212. Thereafter, the step of FIG. 6D is performed so as to complete the manufacture of the package 200b of the environmental sensitive element.

In the present exemplary embodiment, the flexible buffer layer 292 is manufactured on the environmental sensitive element 230. Thus, when the environmental sensitive element 230 is flexed, the film peeling phenomenon results in the flexible buffer layer 292. As a consequence, the film peeling resulted from the flexed environmental sensitive element 230 is improved, such that the light emitting structure is prevented from being damaged when the element is flexed. The product yield is therefore enhanced effectively. Further, as the metal passivation layer 294 of the present exemplary embodiment covers the first barrier structures 212, the vapor and oxygen resistance of the package 200b of the environmental sensitive element is enhanced and the lifespan of the environmental sensitive element 230 is extended effectively.

Figure 8:
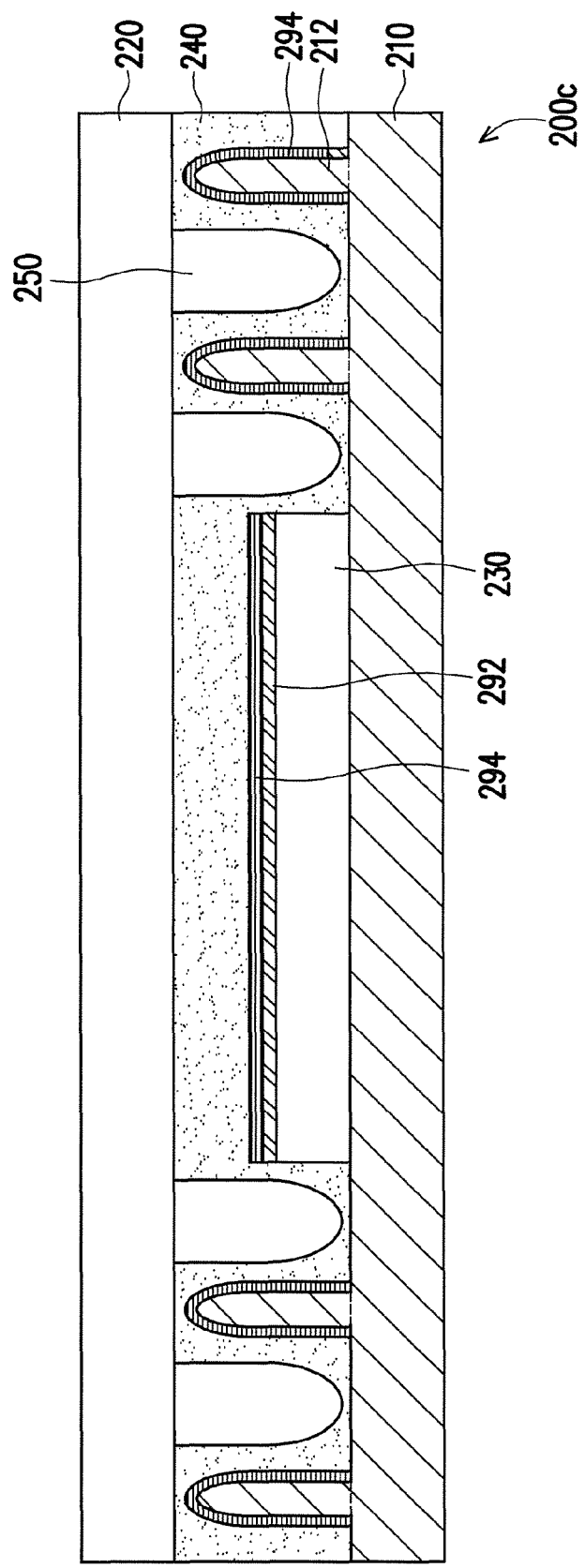
FIG. 8 is a schematic cross-sectional view of an environmental sensitive element package according to another exemplary embodiment.

FIG. 8 is a schematic cross-sectional view of an environmental sensitive element package according to another exemplary embodiment. Referring to FIG. 8, a package 200c of an environmental sensitive element of FIG. 8 is similar to the package 200b of the environmental sensitive element of FIG. 7. The difference between the two is that the package 200b of the environmental sensitive element in FIG. 8 further includes a plurality of second barrier structures 250.

In details, in the present exemplary embodiment, the second barrier structures 250 are disposed on the first substrate 210 and distributed outside the environmental sensitive element 230. The second barrier structures 250 and the first barrier structures 212 are arranged alternately. As for the manufacture, the package 200c of the environmental sensitive element of the present exemplary embodiment adopts a manufacturing method generally similar to that of the package 200b of the environmental sensitive element in FIG. 7. After the step illustrated in FIG. 6B, that is, after the environmental sensitive element 230 is formed on the first substrate 210, the second barrier structures 250 are formed on the second substrate 210. The flexible buffer layer 292 is formed on the environmental sensitive element 230 and the flexible passivation layer 294 is formed on the flexible buffer layer 292 and the first barrier structures 212. Thereafter, the step of FIG. 6D is performed so as to complete the manufacture of the package 200c of the environmental sensitive element.

Figure 9:
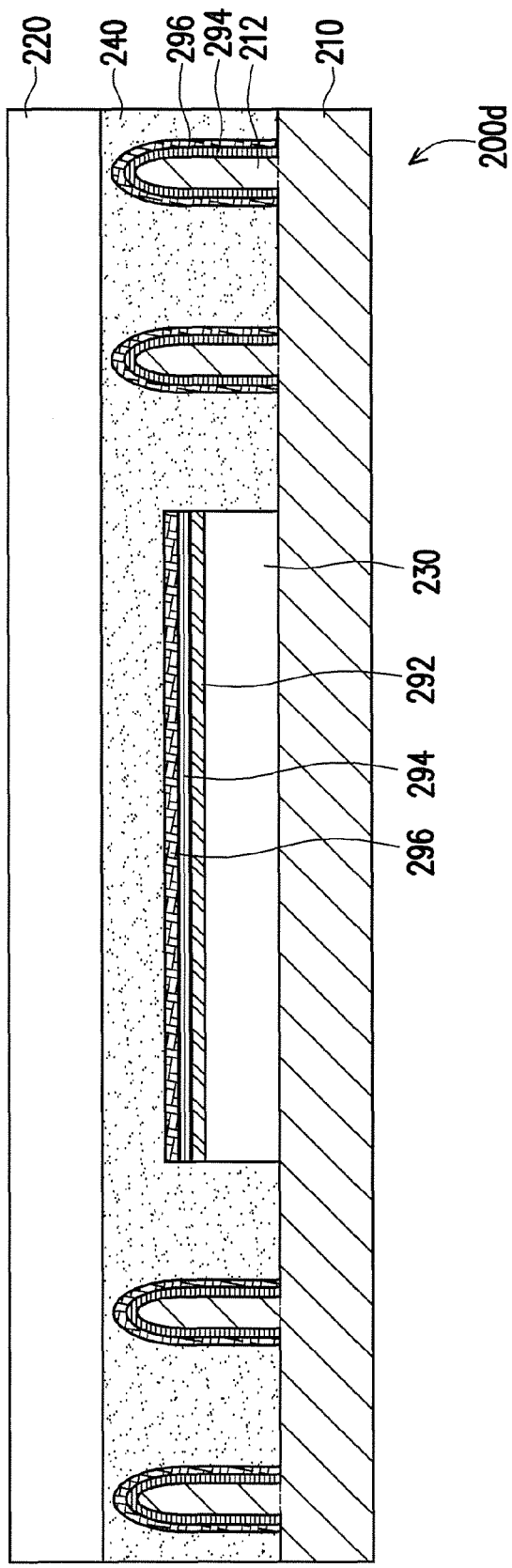
FIG. 9 is a schematic cross-sectional view of an environmental sensitive element package according to another exemplary embodiment.

FIG. 9 is a schematic cross-sectional view of an environmental sensitive element package according to another exemplary embodiment. Referring to FIG. 9, a package 200d of an environmental sensitive element of FIG. 9 is similar to the package 200b of the environmental sensitive element of FIG. 7. The difference between the two is that the package 200d of the environmental sensitive element in FIG. 9 further includes a plurality of passivation films 296. The passivation films 296 are disposed on the flexible passivation layer 294. The passivation films 296 cover a portion of the flexible passivation layer 294 located on the first barrier structures 212. As the first barrier structures 212 are covered by the passivation films 296 and the flexible passivation layer 294, the vapor and oxygen resistance of the package 200d of the environmental sensitive element is enhanced and the lifespan of the environmental sensitive element 230 is extended effectively.

As for the manufacture, the package 200d of the environmental sensitive element of the present exemplary embodiment adopts a manufacturing method similar to that of the package 200b of the environmental sensitive element in FIG. 7. After the flexible passivation layer 294 is simultaneously formed on the flexible buffer layer 292 and the first barrier structures 212, the passivation films 296 are formed on the flexible passivation layer 294 at the same time. The passivation films 296 cover a portion of the flexible passivation layer 294 located on the first barrier structures 212. The step of FIG. 6D is then performed so as to complete the manufacture of the package 200d of the environmental sensitive element.

Figure 10:
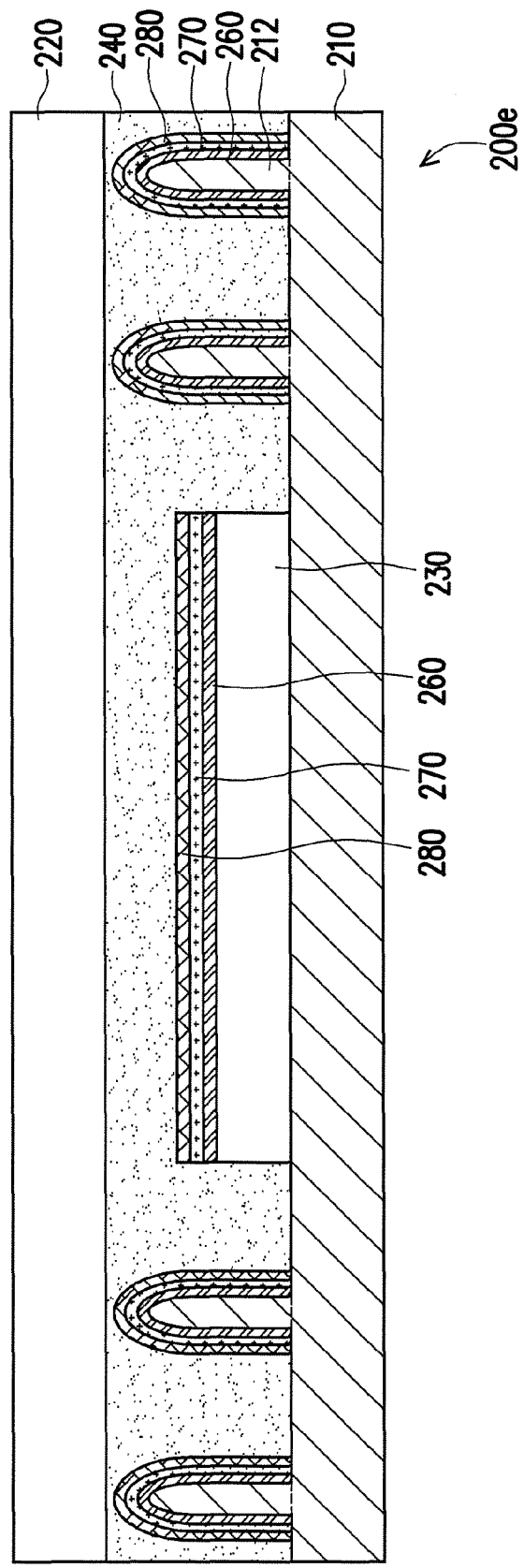
FIG. 10 is a schematic cross-sectional view of an environmental sensitive element package according to another exemplary embodiment.

FIG. 10 is a schematic cross-sectional view of an environmental sensitive element package according to another exemplary embodiment. Referring to FIG. 10, a package 200e of an environmental sensitive element of FIG. 10 is similar to the package 200a of the environmental sensitive element of FIG. 6D. The difference between the two is that the package 200e of the environmental sensitive element in FIG. 10 further includes an absorbent layer 270 and a second passivation layer 280.

In the present exemplary embodiment, the absorbent layer 270 is disposed on the first passivation layer 260. The absorbent layer 270 covers the first passivation layer 260 located on the environmental sensitive element 230 and the first passivation layer 260 located on the first barrier structures 212. The second passivation layer 280 is disposed on the absorbent layer 270. The absorbent layer 270 is located between the first passivation layer 260 and the second passivation layer 280. As the first barrier structures 212 of the present exemplary embodiment are covered with the first passivation layer 260, the absorbent layer 270, and the second passivation layer 280 sequentially, the vapor and oxygen resistance of the package 200e of the environmental sensitive element is enhanced and the lifespan of the environmental sensitive element 230 is extended effectively.

As for the manufacture, the package 200e of the environmental sensitive element of the present exemplary embodiment adopts a manufacturing method similar to that of the package 200a of the environmental sensitive element in FIG. 6D. After the step illustrated in FIG. 6C, that is, after the first passivation layer 260 is formed on the environmental sensitive element 230 and the first barrier structures 212, the absorbent layer 270 is formed on the first passivation layer 260. The second passivation layer 280 is then formed on the absorbent layer 270. The absorbent layer 270 is located between the first passivation layer 260 and the second passivation layer 280. Later, the step of FIG. 6D is performed so as to complete the manufacture of the package 200e of the environmental sensitive element.

As shown in FIG. 6D and FIG. 7 through FIG. 10, formation of the first barrier structures 212 and the layers formed on the first barrier structures 212 (e.g., the first passivation layer 260, the absorbent layer 270, the second passivation layer 280, the flexible passivation layer 294 and/or the passivation films 296) may be omitted based on actual design requirements.

In summary, since a substrate in the disclosure may has an integrally formed barrier structure, the barrier structure surrounds or is distributed outside an environmental sensitive element. The barrier structure and the substrate both adopt stainless steel or glass with superior vapor and oxygen resistance, or plastic integrally formed with the barrier. Therefore, the package of the environmental sensitive element of the disclosure not only has sufficient vapor and oxygen resistance, but can also extend the lifespan of the environmental sensitive element effectively.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. An environmental sensitive element package, comprising:
   a first substrate;
   a second substrate disposed above the first substrate;
   a barrier structure between the first substrate and the second substrate;
   an environmental sensitive element disposed on the first substrate and between the first substrate and the second substrate, wherein the barrier structure is distributed outside the environmental sensitive element;
   a flexible buffer layer disposed on the environmental sensitive element and made of small molecular compounds, oligomers, or organic-inorganic co-steaming materials; and
   an adhesive disposed between the first substrate and the second substrate and encapsulating the environmental sensitive element, the barrier structure, and the flexible buffer layer, wherein an outgassing of the adhesive under 120 degrees Celsius is less than or equal to $5 \times 10^{-7}$ gram/cm$^2$, wherein an outgassing of the flexible buffer layer under 120 degrees Celsius is less than the outgassing of the adhesive under 120 degrees Celsius, and the outgassing of the flexible buffer layer under 120 degrees Celsius is less than $5 \times 10^{-8}$ gram/cm$^2$.

2. The environmental sensitive element package as claimed in claim 1, wherein the barrier structure and the second substrate are integrally formed and substantially made of a same material, the barrier structure and the second substrate are made of stainless steel, glass, or plastic.

3. The environmental sensitive element package as claimed in claim 1, wherein the barrier structure is disposed on the second substrate and protrudes from the second substrate toward the first substrate.

4. The environmental sensitive element package as claimed in claim 1, further comprising:
   a flexible passivation layer covering the flexible buffer layer, wherein the flexible buffer layer is located between the environmental sensitive element and the flexible passivation layer.

5. The environmental sensitive element package as claimed in claim 1, further comprising:
   a plurality of passivation films covering the flexible buffer layer.

6. The environmental sensitive element package as claimed in claim 1, further comprising:
   a flexible passivation layer covering the flexible buffer layer; and
   a plurality of passivation films covering the flexible passivation layer, wherein the flexible passivation layer is between the flexible buffer layer and the plurality of passivation films.

7. The environmental sensitive element package as claimed in claim 1, wherein the outgassing of the adhesive under 120 degrees Celsius ranges from $5 \times 10^{-8}$ gram/cm$^2$ to $5 \times 10^{-7}$ gram/cm$^2$.

8. An environmental sensitive element package, comprising:
   a first substrate;
   a second substrate disposed above the first substrate;
   a barrier structure between the first substrate and the second substrate;
   an environmental sensitive element disposed on the first substrate and between the first substrate and the second substrate, wherein the barrier structure is distributed outside the environmental sensitive element;
   a flexible buffer layer disposed on the environmental sensitive element and made of small molecular compounds, oligomers, or organic-inorganic co-steaming materials; and
   an adhesive disposed between the first substrate and the second substrate and encapsulating the environmental sensitive element, the barrier structure, and the flexible buffer layer, wherein an outgassing of the adhesive under 120 degrees Celsius is less than or equal to $5 \times 10^{-7}$ gram/cm$^2$, wherein an outgassing of the flexible buffer layer under 120 degrees Celsius is less than the outgassing of the adhesive under 120 degrees Celsius, and the outgassing of the flexible buffer layer under 120 degrees Celsius is less than $5 \times 10^{-8}$ gram/cm$^2$, wherein the outgassing of the adhesive increases gradually from a first side of the adhesive near the environmental sensitive element to a second side of the adhesive opposite to the first side of the adhesive.

9. The environmental sensitive element package as claimed in claim 8, wherein the barrier structure and the second substrate are integrally formed and substantially made of a same material, the barrier structure and the second substrate are made of stainless steel, glass, or plastic.

10. The environmental sensitive element package as claimed in claim 8, wherein the barrier structure is disposed on the second substrate and protrudes from the second substrate toward the first substrate.

11. The environmental sensitive element package as claimed in claim 8, further comprising:
   a flexible passivation layer covering the flexible buffer layer, wherein the flexible buffer layer is located between the environmental sensitive element and the flexible passivation layer.

12. The environmental sensitive element package as claimed in claim 8, further comprising:
   a plurality of passivation films covering the flexible buffer layer.

13. The environmental sensitive element package as claimed in claim 8, further comprising:
   a flexible passivation layer covering the flexible buffer layer; and
   a plurality of passivation films covering the flexible passivation layer, wherein the flexible passivation layer is between the flexible buffer layer and the plurality of passivation films.

14. The environmental sensitive element package as claimed in claim 8, wherein the outgassing of the adhesive under 120 degrees Celsius ranges from $5 \times 10^{-8}$ gram/cm$^2$ to $5 \times 10^{-7}$ gram/cm$^2$.

* * * * *